United States Patent
Prabhu et al.

(10) Patent No.: US 7,795,126 B2
(45) Date of Patent: Sep. 14, 2010

(54) ELECTRICAL DIE CONTACT STRUCTURE AND FABRICATION METHOD

(75) Inventors: Ashok Prabhu, San Jose, CA (US); Sadanand R. Patil, San Jose, CA (US); Shaw Wei Lee, Cupertino, CA (US); Alexander H. Owens, Los Gatos, CA (US)

(73) Assignee: National Semiconductor Corporation, Santa Clara, CA (US)

(*) Notice: Subject to any disclaimer, the term of this patent is extended or adjusted under 35 U.S.C. 154(b) by 176 days.

(21) Appl. No.: 11/969,756

(22) Filed: Jan. 4, 2008

(65) Prior Publication Data
US 2008/0102604 A1 May 1, 2008

Related U.S. Application Data

(62) Division of application No. 10/145,295, filed on May 13, 2002, now Pat. No. 7,340,181.

(51) Int. Cl.
*H01L 21/00* (2006.01)
*H01L 21/44* (2006.01)
(52) U.S. Cl. .......................... 438/612; 438/33; 438/108; 438/598
(58) Field of Classification Search .................... 438/33, 438/108, 598, 612
See application file for complete search history.

(56) References Cited
U.S. PATENT DOCUMENTS

| | | | | |
|---|---|---|---|---|
| 5,214,657 A | * | 5/1993 | Farnworth et al. | 714/767 |
| 6,040,235 A | * | 3/2000 | Badehi | 438/464 |
| 6,168,965 B1 | * | 1/2001 | Malinovich et al. | 438/66 |
| 6,326,689 B1 | | 12/2001 | Thomas | |
| 6,329,671 B1 | * | 12/2001 | Tamaki et al. | 257/48 |
| 6,781,244 B2 | | 8/2004 | Prabhu | |
| 7,115,819 B1 | * | 10/2006 | Rumsey | 174/261 |
| 7,557,017 B2 | * | 7/2009 | Yamada et al. | 438/462 |
| 2002/0016024 A1 | * | 2/2002 | Thomas | 438/113 |
| 2003/0080398 A1 | * | 5/2003 | Badehi | 257/678 |

* cited by examiner

*Primary Examiner*—Matthew C Landau
*Assistant Examiner*—James M Mitchell
(74) *Attorney, Agent, or Firm*—Beyer Law Group LLP (57) ABSTRACT

A semiconductor device of the invention includes an integrated circuit formed on a semiconductor substrate having first and second surfaces and a notch region along the edges. The first surface includes electrical contact pads electrically connected with the integrated circuit. The first surface of the semiconductor substrate includes a top protective layer that has a surface portion extending beyond the edges of the semiconductor substrate. The second surface of the semiconductor substrate includes a bottom protective layer with electrical connectors. The surface portion of the top protective layer includes electrical contact pads that are electrically interconnected with electrical contact pad extensions. The electrical contact pad extensions are interconnected with electrical connectors via a backside electrical connector that overlaps the electrical contact pad extensions forming a lap connection. Methods for constructing such devices and connections are also disclosed.

24 Claims, 9 Drawing Sheets

ELECTRICAL DIE CONTACT STRUCTURE AND FABRICATION METHOD

CROSS-REFERENCE TO RELATED APPLICATIONS

This application is a divisional of U.S. patent application Ser. No. 10/145,295, filed May 13, 2002 and entitled "ELECTRICAL DIE CONTACT STRUCTURE AND FABRICATION METHOD"

TECHNICAL FIELD

The invention described herein relates generally to semiconductor chip manufacturing processes. In particular, the invention relates to improved electrical contact structures and the methods for their manufacture.

BACKGROUND

One step in the manufacture of integrated circuit devices is known as "packaging" and involves mechanical and environmental protection of a semiconductor chip which is at the heart of the integrated circuit as well as electrical interconnection between predetermined locations on the silicon chip and external electrical terminals.

Presently, a number of conventional technologies are employed for packaging semiconductors. Wire bonding, tape automatic bonding (TAB), and flip chip connection are among the packaging techniques used in the industry. Additionally, a so-called "T-contact" connector packaging method is employed by some manufacturers. This "T-contact" method is described in some detail in U.S. Pat. No. 6,040,235 which is hereby incorporated by reference.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package footprint may be realized.

Each of the above-described technologies has certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. Such interconnection encounters many problems. For example, variations in the uniformity of the solder bumps as well as in thermal expansion mismatching present problems. These difficulties limit the use of available substrates to silicon or materials which have thermal expansion characteristics similar to those of silicon.

The "T-contact" method yields an interconnect structure that is extremely sensitive to process conditions and suffers from reliability problems associated with "T-contact" disassociation. These problems will be described in greater detail hereinbelow.

Figure 1A:
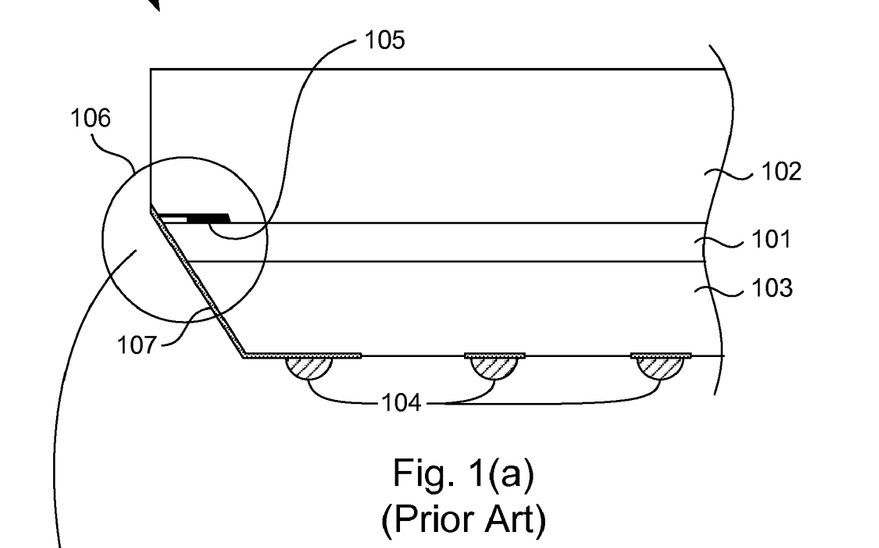
FIGS. 1(a) and 1(b) are simplified schematic cross section views of the edge of a conventional "T-contact" semiconductor die.

The difficulties of a known "T-contact" connection can be illustrated with respect to FIGS. 1(a)-1(d). FIG. 1(a) is a cross-section view depicting an edge portion of a semiconductor die 100 that has just been separated from a semiconductor wafer in a singulation process. A silicon substrate 101 having an integrated circuit formed on its surface has been sandwiched between two glass layers 102, 103. Also depicted are the backside solder balls 104 that are used to interconnect the die 100 to other electrical systems. These backside solder balls 104 are connected to front side electrical contact pads 105 by a specialized electrical connection called a "T-contact". In this view, one such interconnection is shown by the metal layer 107 which makes electrical contact with one of the backside solder balls 104.

Figure 1B:
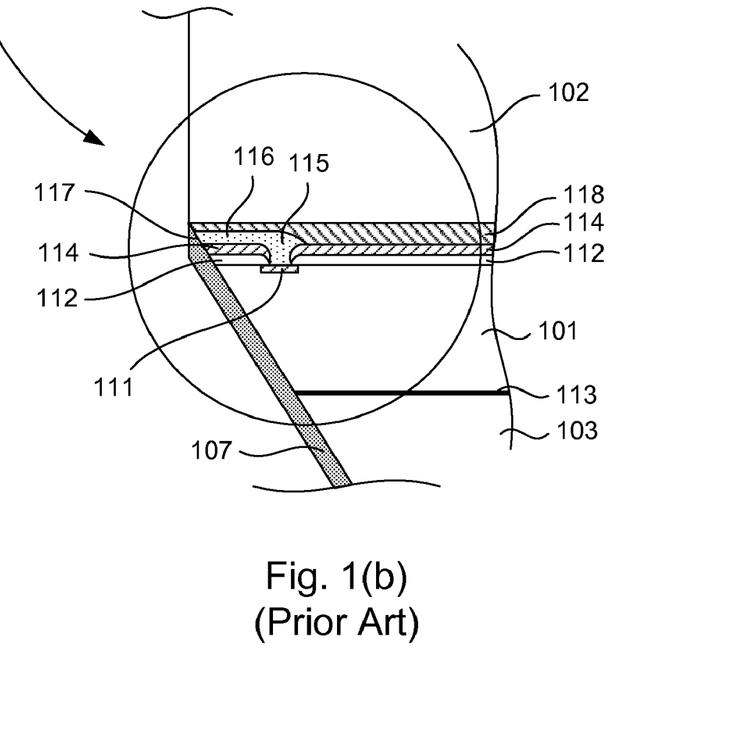

FIG. 1(b) is a close-up view depicting the "T-contact" electrical connection shown in the circular view 106 of FIG. 1(a). The backside glass layer 103 affixed to the substrate 101 with a thin epoxy layer 113. On the other side (the front side) of the silicon substrate 101 is a metal bonding pad 111 that is interconnected to the electronic circuitry formed on the silicon substrate 101. Also, on top of the silicon substrate 101 is a first passivation layer 112 that is typically formed of $SiO_2$. Some manufacturers add a second passivation layer 114, formed of benzo-cyclo-butene (BCB), onto the first passivation layer 112. The metal bonding pad 111 is accessible through an opening in the passivation layers 112, 114. Into the opening in the passivation layers 112, 114 is deposited a metal plug 115. Such plugs are commonly formed of Al—Si—Cu compounds (e.g., 94.5% Al, 5.0% Si, and 0.5% Cu). A tab 116 is typically formed over a portion of the passivating layers 112, 114 as shown. The tab 116 portion includes an exposed facet 117 which has an exposed surface.

A top protective layer 102 is attached to the top surface of the substrate 101 using a thin layer of epoxy 118. A metal layer 107 formed on the side of the die 100 forms an electrical contact with the exposed facet 117 thereby forming a conducting pathway to a corresponding solder ball (not shown) on the bottom of the die 100. Commonly, the metal layer 107 is formed of a different material than the plug 115 and tab 116 materials. In one example, the metal layer 107 is constructed of a deposited layer of aluminum/copper (Al/Cu) material. Many other process steps are used to construct such structures. A full description of an example process for constructing such structures is included in the previously referenced U.S. Pat. No. 6,040,235.

Figure 1C:
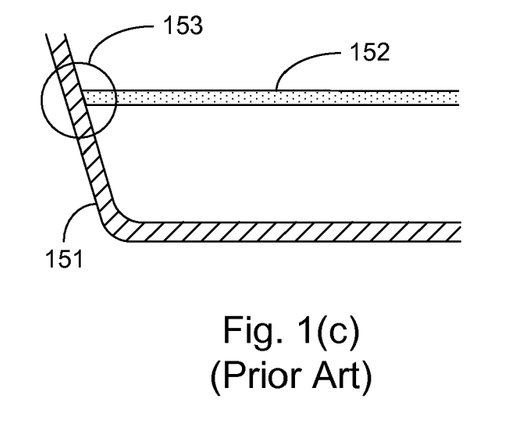
FIGS. 1(c) and 1(d) are simplified schematic cross section views of the edge of a conventional "T-contact" semiconductor die and a depiction of "T-contact" failure.
Figure 1D:
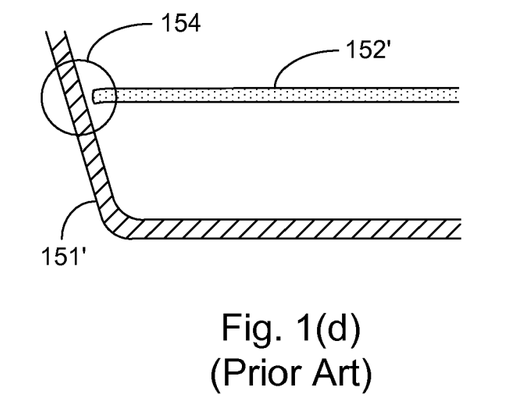

Although suitable for some purposes, the aforementioned implementation has some serious drawbacks which will be described with respect to the simplified schematic illustrations of FIGS. 1(c) and 1(d). FIG. 1(c) schematically depicts a simplified cross-section view of an intact "T-contact". A metal layer 151 is shown in electrical contact with a tab 152 that is electrically connected to a bonding pad (e.g., as in FIG. 1(b)). The connection between the metal layer 151 and the tab 152 is called a "T-contact" 153. Under processing conditions, and also under some operating conditions the "T-contact" 153 can undergo significant stresses. Under some conditions, a separation can occur in the "T-contact" 153 causing electrical connection failure and consequently chip failure. This situation is schematically depicted in FIG. 1(d) which shows a simplified cross-section view of an disconnected "T-contact" 154. The interconnect metal layer 151' is shown with a break in electrical contact to the contact 152', thereby breaking the electrical connection to the bonding pad (not shown). The depicted "T-contacts" are very vulnerable to this kind of connection failure. Among the advantages of the disclosed invention is that it substantially reduces the aforementioned type of connection failure.

What is needed is a manufacturable robust electrical connection that does not suffer from "T-contact" failure. Also needed are methodologies for fabricating such structures. The principles of the present invention are directed toward an improved electrical connection and methodologies for its fabrication.

SUMMARY OF THE INVENTION

In accordance with the principles of the present invention, the invention includes, among other things, a robust electrical connection and methods for its fabrication.

In one embodiment a semiconductor device having a plurality of edge mounted electrical contacts is disclosed. The embodiment includes an integrated circuit formed on a semiconductor substrate with first and second surfaces and a notch region along the edges. The first surface includes electrical contact pads electrically connected with the integrated circuit. The first surface of the semiconductor substrate includes a top protective layer that has a surface portion extending beyond the edges of the semiconductor substrate. The surface portion of the top protective layer includes electrical contact pads that are electrically with electrical contact pad extensions. The second surface of the semiconductor substrate includes a bottom protective layer with electrical connectors. The electrical contact pad extensions are interconnected with electrical connectors via a backside electrical connector that overlaps the electrical contact pad extensions forming a lap connection.

Another embodiment discloses a method for producing electrical die contact structures for integrated circuit devices. The method includes the steps of providing a plurality of integrated circuits on a semiconductor wafer. The wafer having a front side and a backside, with each of the integrated circuits being delineated from other integrated circuits on the wafer by a plurality of saw streets. Further, each integrated circuit includes a multiplicity of electrical contact pads having contact pad extensions that extend into the saw streets. To the front side of this wafer is attached a front side protective layer. Material is removed from the backside of the wafer in the saw streets until a bottom surface of the contact pad extensions is exposed. Electrical connections are formed on the backside of the semiconductor substrate. A backside metal layer is formed having a tail portion of the metal layer overlapping the bottom surface of the contact pad extensions and the contact pad extensions are electrically interconnected with electrical connections. Then the integrated circuit devices are separated into individual devices.

These and other aspects of the invention will be disclosed in greater detail in the following detailed description.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is specifically pointed out that the depictions in the drawings are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Figure 2:
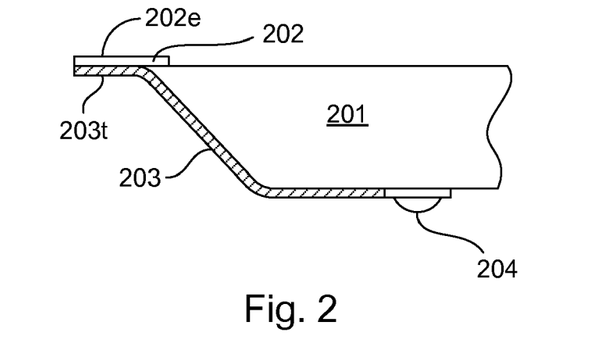
FIG. 2 is a simplified cross-sectional view of an improved electrical connector in accordance with the principles of the present invention.

One aspect of the invention includes the fabrication and implementation of a semiconductor die having a plurality of robust edge mounted electrical connectors. FIG. 2 depicts one embodiment of the invention including a top contact pad 202 that extends beyond the edges of a semiconductor substrate 201. Such a top contact pad 202 can include either an outer contact pad extension that forms part of an extended length contact pad or a separate outer contact pad extension that is electrically connected to a corresponding inner contact pad using an electrically conducting bridge. Either of these extensions are referred to herein as contact pad extensions. The contact pad extension 202e of the top contact pad 202 presents a robust and substantially flat contact surface for further electrical connections. A backside metal layer 203 is formed on the backside of the semiconductor substrate 201. The backside metal layer 203 is also formed on an edge portion of the semiconductor substrate 201 and formed over a flat portion of the contact pad extension 202e that extends beyond the edges of a semiconductor substrate 201. This backside metal layer 203 is also electrically connected to a corresponding electrical connector 204 on the backside surface of the semiconductor substrate 201. The portion 203t of the backside metal layer 203 that contacts the contact pad extension 202e of the top contact pad 202 is referred to as the tail 203t. Each tail 203t forms an electrical connection with a corresponding contact pad extension 202e. In some embodiments, the tail 203t is substantially co-planar with the contact pad extension 202e. The details of such an embodiment are disclosed in greater detail hereinbelow. Such a structure is robust and not as vulnerable to process condition variations as the "T-contact" or other electrical connections and packaging methodologies.

Figure 3:
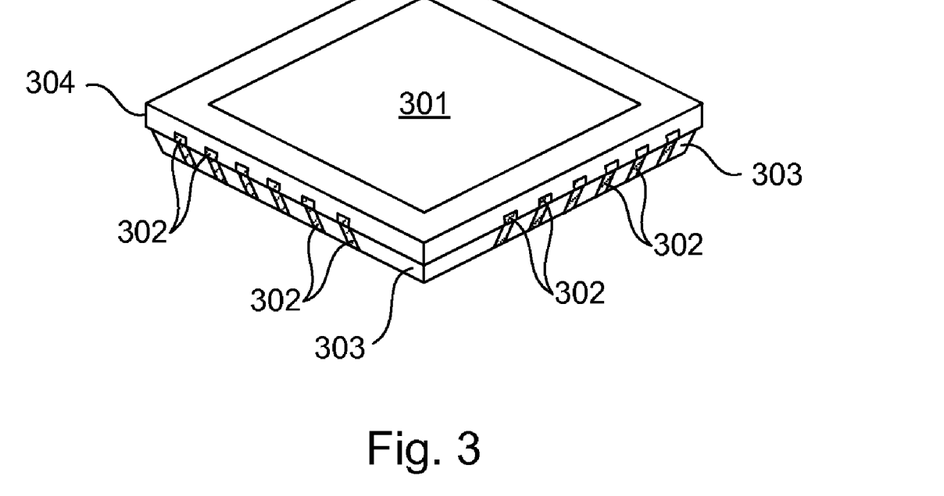
FIG. 3 is a perspective view of a semiconductor substrate embodiment constructed in accordance with the principles of the present invention.

FIG. 3 illustrates a preferred embodiment of a semiconductor die 300 having an integrated circuit device 301 formed thereon. In one embodiment, the integrated circuit device 301 comprises an image sensor constructed and operative in accordance the principles of the present invention. Any number of other types of integrated circuit devices can be formed on the semiconductor die. The depicted embodiment includes a relatively thin and compact, environmentally protected and mechanically strengthened integrated circuit package having a multiplicity of electrical contacts 302 formed along the edge surfaces 303 thereof. In accordance with a preferred embodiment of the invention, contacts 302 extend over edge surfaces 304 of the package.

Figure 4:
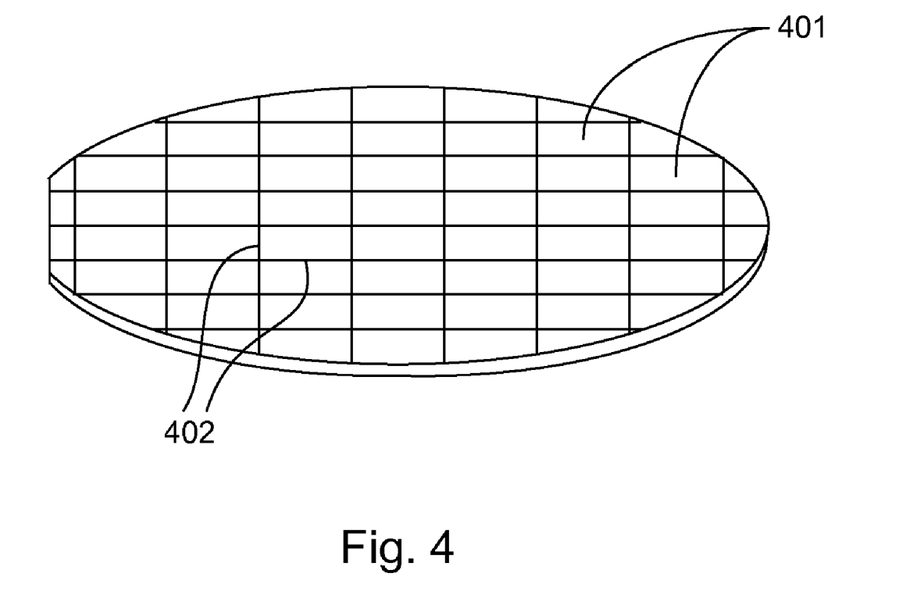
FIG. 4 is a perspective view of a semiconductor wafer in readiness for processing in accordance with the principles of the present invention.

FIG. 4 depicts a complete silicon wafer 400 having a plurality of finished dies 401 formed thereon by conventional techniques. This silicon wafer 400 forms a basic starting point for many of the process methodologies described hereinbelow. In a typical implementation, an eight inch silicon wafer about 750 micron (µ) thick is used. Other wafer materials can be used including, but not limited to gallium arsenide (GaAs), gallium indium arsenide (GaInAs), or other semiconductor materials. Additionally, wafers of different sizes can also be used. Also depicted, are "saw streets" 402 which are used to delineate the scribe lines used to separate ("singulate") the dies 401 into individual IC chips.

Figure 5A:
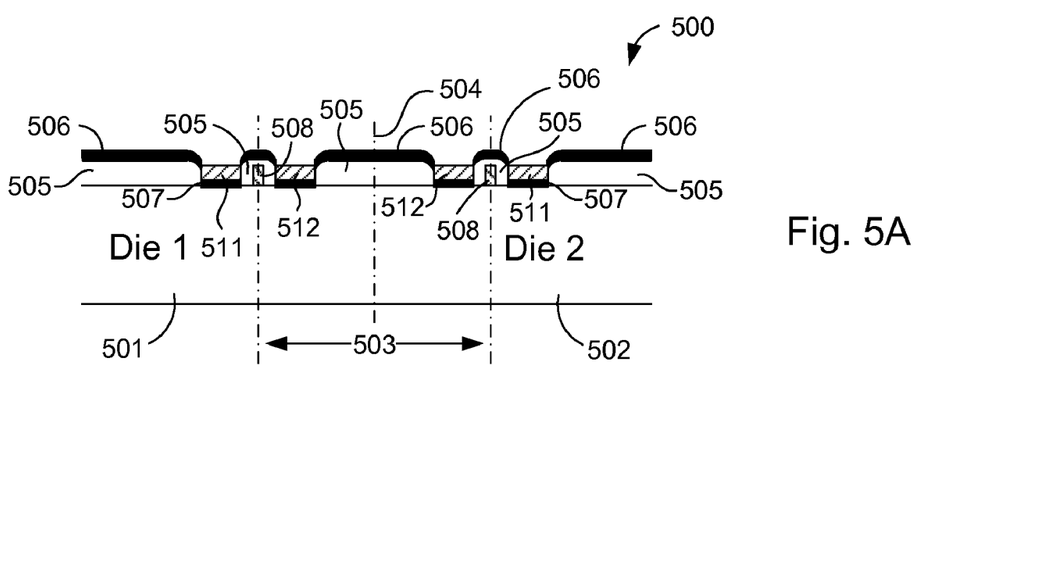
FIGS. 5A-5P are cross-section views of a portion of a semiconductor substrate showing a process embodiment used for fabricating a lap junction electrical connector in accordance with the principles of the present invention.

FIG. 5A is a cross-section view of a portion of a wafer 500. The depicted portion of the semiconductor substrate 510 shows the intersection of a first die 501 and a second die 502. The depicted wafer is about 750µ thick. The boundaries of a saw street 503 are identified by the dashed/dotted lines. The center of a scribe line 504 is also depicted. The saw street 503 is a region where a saw blade singulates the wafer along the scribe line 504. In the depicted embodiment the saw street is on the order of about 250µ wide. The wafer is shown having a first passivation layer 505. Many dielectric materials can be used to form the first passivation layer 505. Typical examples include, but are not limited to $SiO_2$, nitride materials, low-K dielectric materials, as well as many other suitable insulating materials. An optional second passivation layer 506 can also be formed on the first passivation layer 505. Such a second passivation layer 505 can be formed using, for example, BCB. In the depicted embodiment, each die has an inner contact pad 507 that is electrically connected to the integrated circuit of its respective die (not shown here). In the depicted embodiment, each die 501, 502 also has a metal guard ring 508.

Above each contact pad 507 is an inner opening in the passivation layers 505, 506. The depicted embodiment includes an outer opening formed in the passivation layers 505, 506. This outer opening is formed on the other side of the guard ring 508 from the inner opening. Inner conducting plugs 511 are formed in the inner openings in the passivation layers. Also, outer conducting plugs are formed in the outer openings in the passivation layers to form contact pad extensions 512. This is distinct from conventional embodiments, which do not include both inner and outer conducting plugs. Conducting materials are used to form the inner conducting plugs 511 and contact pad extensions 512 (i.e., the outer conducting plugs). Such materials are commonly metals and metal alloys, for example, Al—Si—Cu compounds (e.g., 94.5% Al, 5.0% Si, and 0.5% Cu). Many other conducting materials or compounds can be used.

Figure 5B:
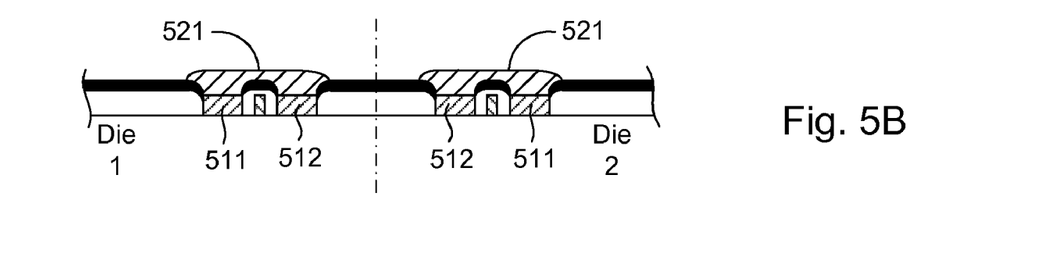

FIG. 5B depicts a next step in the process embodiment. FIG. 5B depicts only the uppermost portion of the wafer depicted in FIG. 5A. The inner conducting plugs 511 are electrically connected to the contact pad extensions 512 by a bridge layer 521. This is typically achieved by selectively depositing the bridge layer 521 of conducting material over the guard ring 508 onto an inner conducting plug 511 and its corresponding contact pad extension 512 thereby establishing a conducting path between them. This is a departure from conventional processes that do not use contact pad extensions, instead relying on "T-contacts". Such bridge layers 521 are formed of conducting materials (e.g., metals, alloys, and other conducting materials or compounds). In preferred embodiment the bridge layer 521 is comprised of the same materials as the inner conducting plug 511 and contact pad extension 512. In one embodiment a bridge layer 521 comprises an Al—Si—Cu compound (e.g., 94.5% Al, 5.0% Si, and 0.5% Cu). Many other conducting materials and compounds can be used.

Figure 5C:
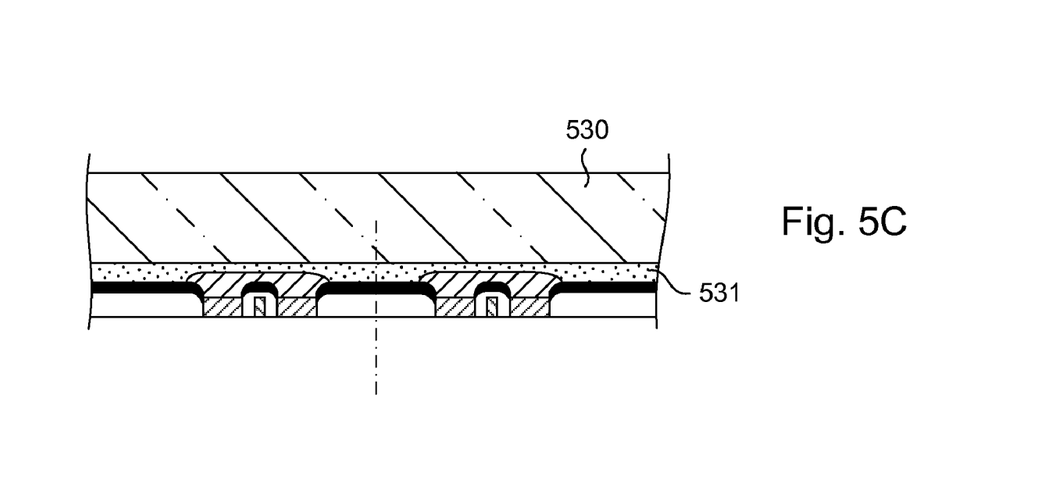

Referring to FIG. 5C, a next step in the embodiment comprises bonding the top surface of the wafer 500 to an insulating cover plate 530 (also referred to herein as a protective layer). Typically, the protective layer 530 is bonded using a layer 531 of adhesive such as epoxy. The protective layer 530 typically comprises glass, alumina, beryllia, sapphire or any other suitable insulative substrate. Such protective layers 530 can be of any thickness. In one preferred embodiment, the protective layer 530 is about 400µ thick. The epoxy layer 531 should be relatively thin. In one embodiment the epoxy layer 531 is about 10µ. Typically, the protective layer 530 is attached by applying epoxy and the protective layer to the wafer. The wafer and protective layer are spun at an appropriate temperature and pressure.

In cases where the integrated circuit device formed in the wafer 500 is an optical device (e.g., optical imagers, lasers, optical transceivers, photo-sensors, arrays of photodiodes, charge coupled devices (CCD's), CMOS devices, and numerous other light sensitive optical detectors or other related optical devices) the epoxy 531 can be an optically transmissive epoxy. Also, the protective layer 530 can be optically transmissive. Where the optical properties of the protective layer 530 and epoxy 531 are not important to the function of the integrated circuit device, other protective layers 530 and epoxies 531 may be used.

Figure 6A:
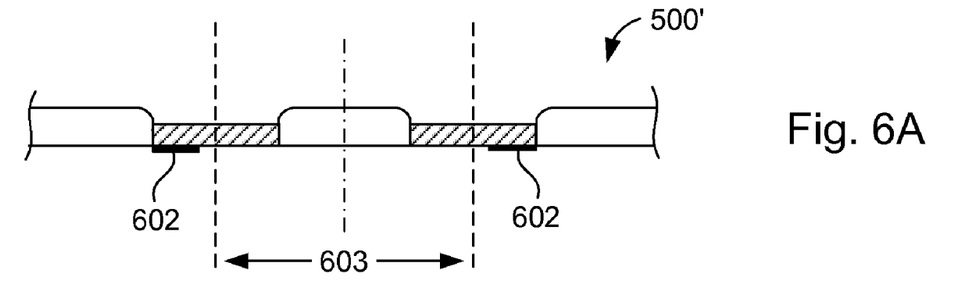
FIGS. 6A and 6B are cross-section views of a portion of a semiconductor substrate having an extended length electrical contact pad used in another process embodiment for fabricating a lap junction electrical connector in accordance with the principles of the present invention.

FIG. 6A depicts an alternative embodiment. An extended length plug 601 is used in place of the previously discussed inner and outer plugs. Wafer 500' includes an extended length contact pad 601 that is used in place of the previously discussed inner and outer contact pads. Each extended length contact pad 601 is in electrical contact with a contact pad 602 that is electrically connected (not shown here) to the integrated circuit of its respective die. This extended length plug 601 has a portion that extends into the saw street 603. This embodiment has the advantage of not requiring an additional step to form the bridge between two plugs. Such an embodiment is particularly suitable for use with wafers 500' that do not include guard rings.

Figure 6B:
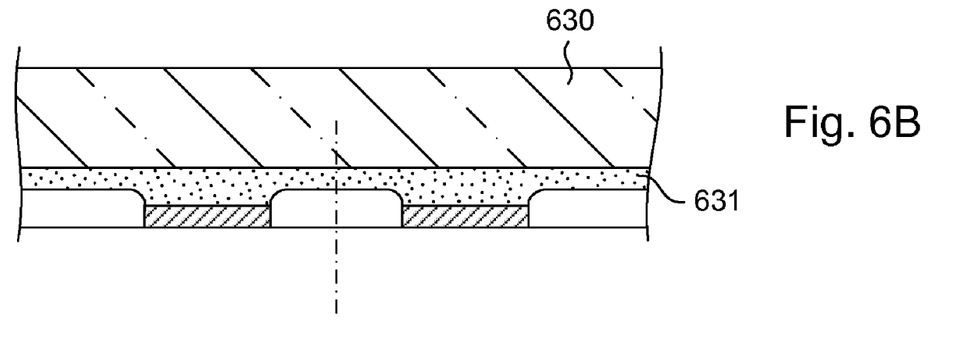

FIG. 6B depicts an approach for attaching a protective layer. Similar to the approach used in describing FIG. 5C, a protective layer is bonded to the top of the depicted wafer. In FIG. 6B, a protective layer 630 is bonded to the top surface of the wafer 500' via a layer 631 of epoxy. As above, the protective layer 630 can comprise glass, alumina, beryllia, sapphire or any other suitable insulative substrate. Also, as above a protective layer 630 can be of any thickness, with a preferred thickness being about 400µ. In cases where the integrated circuit device formed in the wafer 500' comprises an optical device the epoxy 631 and protective layer 630 can be an optically transmissive epoxy. Other protective layers 630 and epoxies 631 can also be used where desired.

Figure 5D:
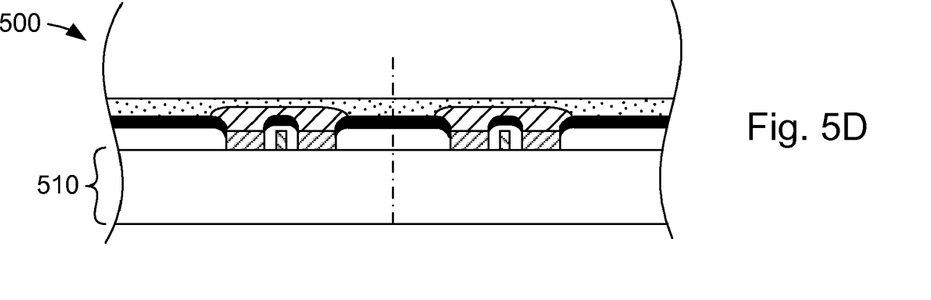

The process can continue from either FIG. 5C or 6B. Although the following steps FIGS. 5D-5P are applicable to both the processes, the invention is disclosed with reference to FIGS. 5A-5C and FIGS. 6A-6B. As such, the following explanation will be directed to the embodiment of FIGS. 5A-5C. As depicted in FIG. 5D, the wafer 500 is thinned. Although such wafer thinning is not strictly necessary to practice the invention, it is advantageous to do so. FIG. 5D is a cross-section view of the lower portion of the wafer 500 depicted in FIGS. 5A-5C. Specifically depicted is a portion of the wafer referred to here as a semiconductor substrate 510. In one embodiment, the substrate 510 can be thinned in a two-step process. A bulk grinding process and a stress removal process. Bulk grinding can be achieved by a number of commonly used processes known to persons having ordinary skill in the art. For example, chemical mechanical polishing (CMP) or grinding may be used. In one embodiment, the backside of the substrate 510 can be thinned by using a grinding apparatus such as a Model 32BTGW using 12.5 A abrasive, which is commercially available from Speedfam Machines Co., Ltd. of England. In typical embodiments the bulk back-grinding this the substrate 510 to about 75-110μ.

The stress removal portion of the two-step process can be implemented using other techniques. In order to remove mechanical stresses induced by the bulk back-grinding and to obtain a final thickness, the wafer is then subjected to precision removal of backside material. Such precision removal of backside material removes the final 10-15μ of material from the backside of the semiconductor substrate 510. This continues until the semiconductor substrate 510 is about 65μ to about 80μ thick. In one preferred embodiment, the final substrate thickness is about 75μ thick. Many processes known to persons having ordinary skill in the art can be used to achieve precision removal of material from the backside surface of the semiconductor substrate 510. In one embodiment, atmospheric downstream plasma (ADP) etching is used to thin wafers by precision removal of backside material. In one example process, a wafer having been subjected to bulk back-grinding is placed in a process chamber of an ADP etch system. For example, a TE-2001 series ADP machine available from Tru-Si Technologies of Sunnyvale, Calif. can be used. An argon flow of about 1 standard liter per minute (slm) is supplied along with a gas flow of suitable fluorine containing gases. Examples of suitable fluorine containing gases include $CF_4$, $SF_6$, as well as other fluorine containing gases. Suitable gas flow rates for the fluorine containing gases are about 4 slm to about 6 slm, but may vary with gas type chosen as well as other process needs. Such precision removal of backside material continues until the semiconductor substrate 510 obtains the final desired thickness.

Figure 5E:
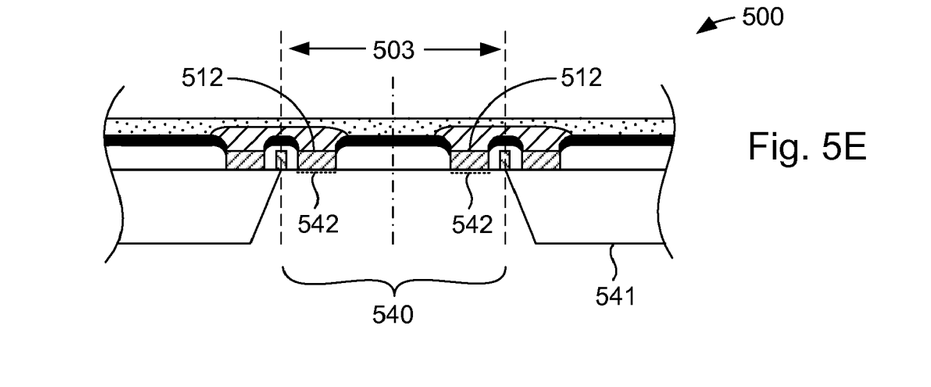

FIG. 5E is a cross-section view of the lower portion of the wafer 500 depicted in FIGS. 5A-5D. FIG. 5E depicts a first etching of the backside surface 541 of the wafer to form an opening 540 in the saw street 503. This first etching continues until the front side passivation layer 505 and field oxide layer 542 (mostly located beneath the outer conducting plugs 512) is reached. This can be achieved using a variety of the etch techniques known to person having ordinary skill in the art. In one example, a wet etch using a conventional silicon etching solution, such as a combination of 2.5% hydrofluoric acid, 50% nitric acid, 10% acetic acid and 37.5% water, so as to etch the silicon down to the field oxide layer 542, as shown in FIG. 5E. The etching stops when front side oxide and passivation layers are reached.

Figure 5F:
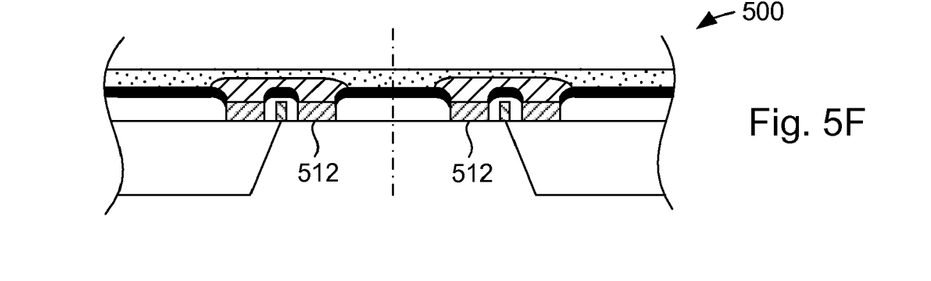

FIG. 5F is a cross-section view of the lower portion of the wafer 500 depicted in FIGS. 5A-5E. FIG. 5F depicts a second etching of the backside of the wafer to remove any remaining oxide layer to expose the bottom of the contact pad extensions 512. Typically, dry etch techniques are used. For example, using an Argon etch at about 8-10 kA. The second etching stops when front side oxide is removed and the metal of the contact pad extensions 512 is exposed.

Figure 5G:
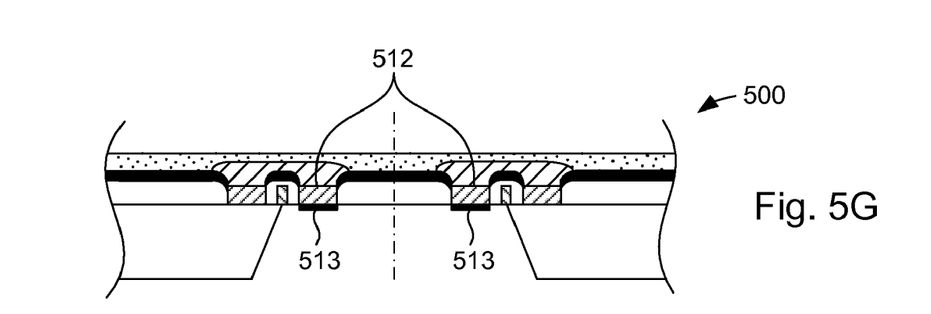

FIG. 5G depicts an optional contact pad thickening step. The bottom surface of the contact pad extensions 512 can be treated with a layer of conducting material 513 to form a thickened contact pad extension. In one implementation the conducting material can be deposited onto the bottom of the contact pad extensions 512. The conducting material can be metals, alloys, or other conducting compounds. Other methods including, but not limited to electroplated, sputter deposition, or other metal deposition techniques can be used to form the layer of conducting material 513. In preferred embodiments, the layer of conducting material 513 is formed of the same material as the contact pad extensions 512. In some embodiments, the layer of conducting material 513 can be formed of Al—Si—Cu or Al—Cu compounds.

Figure 5H:
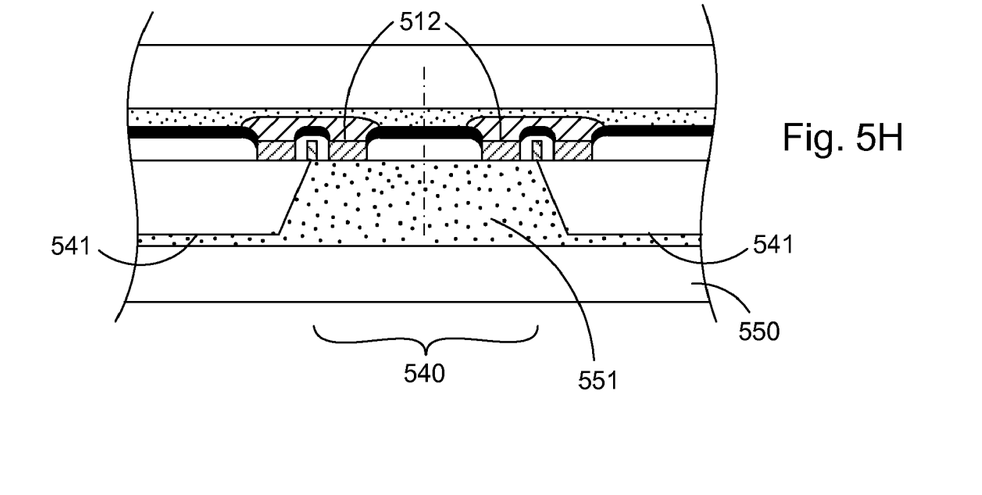

Referring to FIG. 5H, the next step in the embodiment comprises bonding the bottom surface 541 of the wafer to an insulating cover plate (also referred to herein as a bottom protective layer 550) via a second epoxy layer 551. As with the top protective layer, the bottom protective layer 550 typically comprises glass, alumina, beryllia, sapphire or other suitable insulative substrates. Such bottom protective layers 550 can be attached by applying the second epoxy layer 551 and the protective layer 550 to the wafer thickness. In one embodiment, the bottom protective layer 550 is about 400μ thick. The second epoxy layer 551 coats the bottom side of the wafer 541 and fills the opening 540 and covers the contact pad extensions 512. The second epoxy layer 551 should be relatively thin. In one embodiment the second epoxy layer 551 can be about 10μ thick. The wafer and protective layer are attached by spinning together at an appropriate temperature and pressure.

Figure 5I:
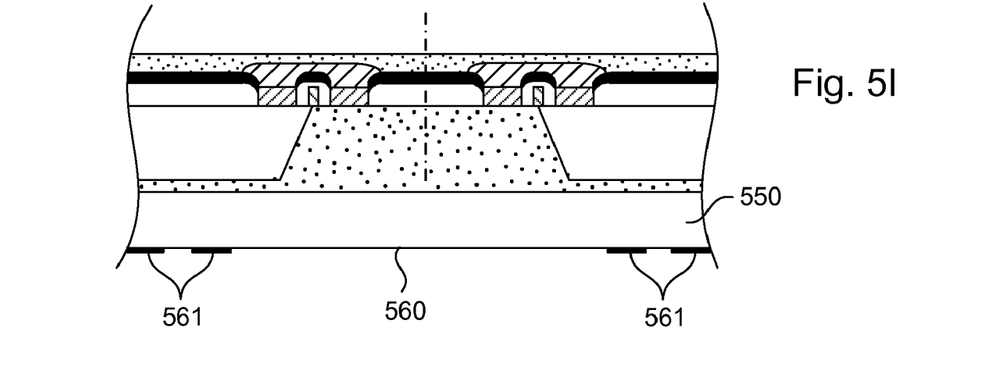

FIG. 5I depicts a next step of forming a plurality of backside pads 561. The backside pads 561 are patterned and formed on the bottom surface 560 of the bottom protective layer 550. It should be noted that this step can be implemented at many other stages in the process. The backside pads 561 are formed of a material having a low coefficient of thermal expansion. This is because metal contacts that are formed on the backside pads 561 are subjected to reflow processes (explained later) which can transfer heat to the bottom protective layer 550. Such heat transfer can result in damage to the backside pads 561. To avoid this problem, backside pads 561 are formed of materials having a low coefficient of thermal expansion (also, referred to as low modulus materials). These backside pads 561 can be patterned using any methodologies known to person having ordinary skill in the art. Typical examples include, but are not limited to selective deposition of low modulus material or deposition of the low modulus material coupled with selective etching to form the desired pattern of backside pads 561. Many low modulus materials can be used to form the pattern of backside pads 561. However, a preferred material is common photo-resist material.

Figure 5J:
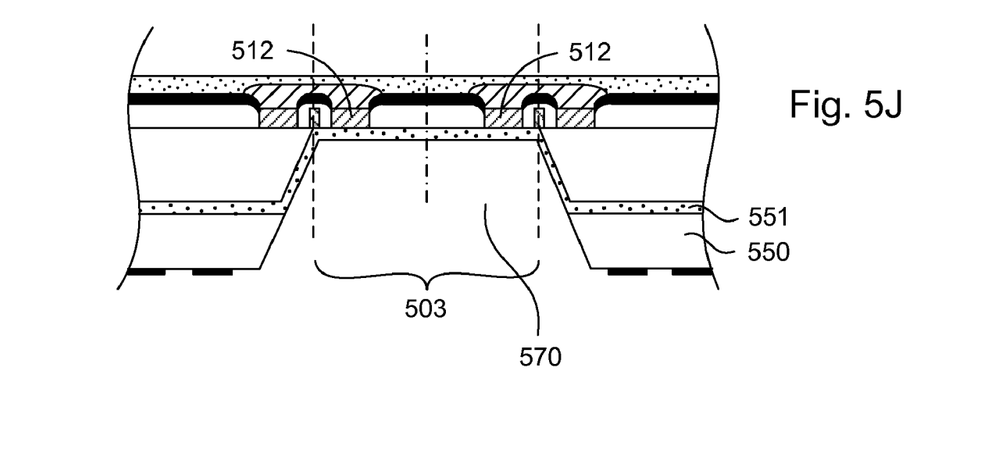

Referring to FIG. 5J, the next step in the embodiment comprises notching step wherein the bottom protective layer 550 and the second epoxy layer 551 are notched in the saw street 503. Typically such backside notching can be achieved by cutting a notch 570 in the saw street region 503. The cut passes completely through the bottom protective layer 550 and into the second epoxy layer 551. The notch 570 does not penetrate completely through the second epoxy layer 551. A thin layer of second epoxy about 10-20μ thick remains at the bottom of the notch 570. The metal of the contact pad extensions 512 is not exposed. Also, in embodiments where a layer of conducting material 513 (e.g., as shown in FIG. 5G) is formed on the contact pad extensions 512, the layer of conducting material 513 is not exposed.

For clarity, throughout the specification and claims, the terms "cutting" and "cut" shall have broader than usual meaning and shall refer to removal of material or separating along a line by any suitable technique, such as, for example, etching, sawing, sandblasting and milling. In one embodiment the notch 570 is made by cutting with a scribing apparatus such as a Kulicke & Soffa 775 dicing saw employing an Ni plated diamond loaded blade.

Figure 5K:
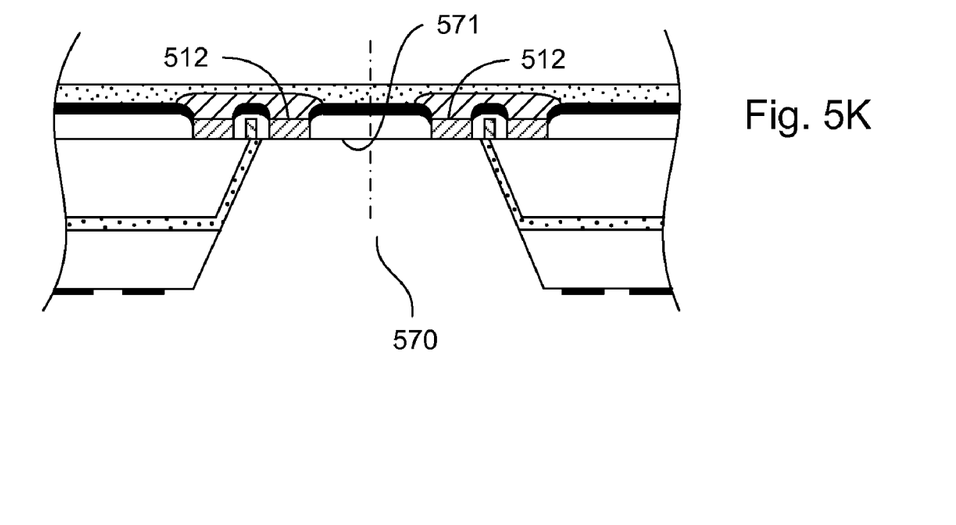

Referring to FIG. 5K, a second epoxy removing step is performed. In this step the thin layer of second epoxy is removed from the bottom 571 of the notch 570 exposing the contact pad extensions 512. This second epoxy removal can be achieved using any material removal techniques known to those having ordinary skill in the art. In one embodiment the thin layer of second epoxy is removed using plasma etching techniques, for example, using an oxygen plasma etch. Such etching continues until the bottom of the contact pad extensions 512 are exposed. At this point the exposed bottom surface of the contact pad extensions 512 can be cleaned of any remaining residues.

Figure 5L:
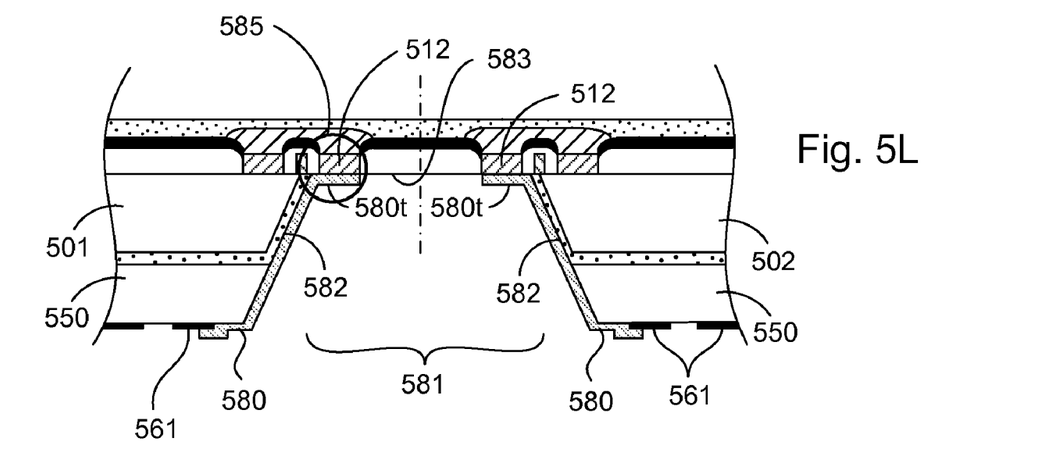

Referring to FIG. 5L, a backside metal layer is formed. The backside metal layer 580 is formed in accordance with a pattern that enables electrical connectors on the backside of the wafer to be connected with the integrated circuitry formed on the front side of the wafer. The backside metal layer 580 can be formed of any conducting material, but in preferred embodiments is formed of highly conductive metal metals or alloys. Typical examples include, but are not limited to aluminum, copper, and other conducting materials and alloys. In the depicted embodiment, the backside metal layer 580 is formed in the notch region 581. In particular, on the bottom surface of the contact pad extensions 512, the side walls 582 of the notch, and on the surface the bottom protective layer 550. In this way individual connections can be made between the contact pad extensions 512 and the backside pads 561. The backside metal layer 580 overlaps the bottom surface contact pad extension 512 forming a lap junction (or lap connection) 585. The backside metal layer 580 makes a relatively flat contact with the flat bottom surface of a corresponding contact pad extension 512. This is quite different from the transverse connection made in the prior art "T-contact". The portion 580t of the backside metal layer 580 making contact with the contact pad extension 512 is referred to as a tail 580t. The materials of the tail 580t and of the contact pad extension 512 are chosen such that they form a robust alloyed junction. Materials of preferred embodiments are chosen such that the lap junction 585 is formed of a single alloyed material. This forms a considerably stronger electrical connection than that known in the "T-contact" connection which uses two separate materials. This robustness is enhanced by the flat nature of the contact at the lap junction 585. This forms an electrical contact that is substantially more robust than the aforementioned "T-contact".

In the depicted embodiment, the backside metal layer 580 includes an opening 583 between the backside metal layer 580 of die 1 501 and backside metal layer 580 of die 2 502. Such a configuration can be achieved by selective deposition of the backside metal layer 580 in the desired locations. Alternatively, such a configuration can be achieved by deposition of the backside metal layer 580 over the entire backside surface and the selectively etching away the metal until the backside metal layer 580 remains in the desired locations. The advantages of such a configuration will be presently discussed below. In an alternative embodiment, the backside metal layer 580 is deposited along the entire bottom surface of the notch, including the opening 583. Such a structure has the advantage of being simpler to construct, but also does not supply a readily configured encapsulation of the junction between the tail 580t and the contact pad extension 512.

Returning to the discussion of FIG. 5L, the structure is cleaned to present a good surface for further processing. Typically, such cleaning is used to remove, among other things, oxide build up on the backside metal layer 580. In one implementation plasma dry etching is used to clean the backside metal layer 580. Once cleaned, the surface of the backside metal layer 580 can be treated with a second backside metal layer. Typically, this is electro-plated or deposited onto the backside metal layer 580. This second backside metal layer is typically formed of a "protective" conducting material such as nickel, platinum, or gold. In one embodiment, the backside metal layer 580 has a second backside metal layer formed of a nickel layer about 2500-4000 nm thick. A gold layer of about 70-200 nm thick can be formed on the nickel layer.

Figure 5M:
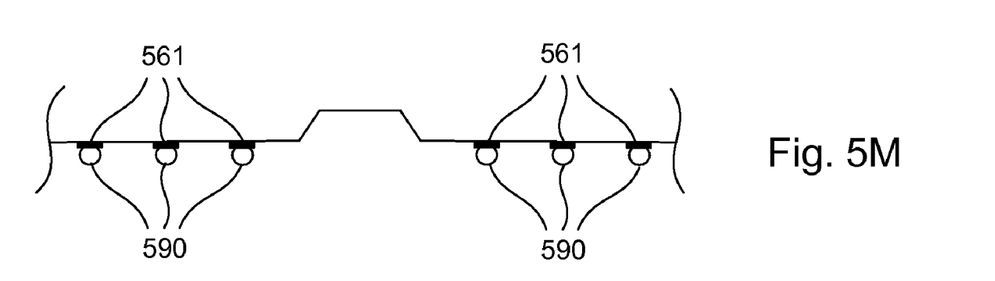

Referring to FIG. 5M, electrical connections can be formed on the backside pads 561. FIG. 5M depicts a cross-section view of a portion of the backside of a wafer. In the depicted embodiment, a solder material can be deposited on the backside pads 561. This solder material can be reflowed to form solder balls 590 on the backside pads 561. Typical solder materials include, but are not limited to eutectic solders (e.g., tin (Sn)/silver (Ag)/lead (Pb) solders and Sn/Pb solders). Also, the inventor also specifically contemplates the use of lead-free solders.

Figure 5N:
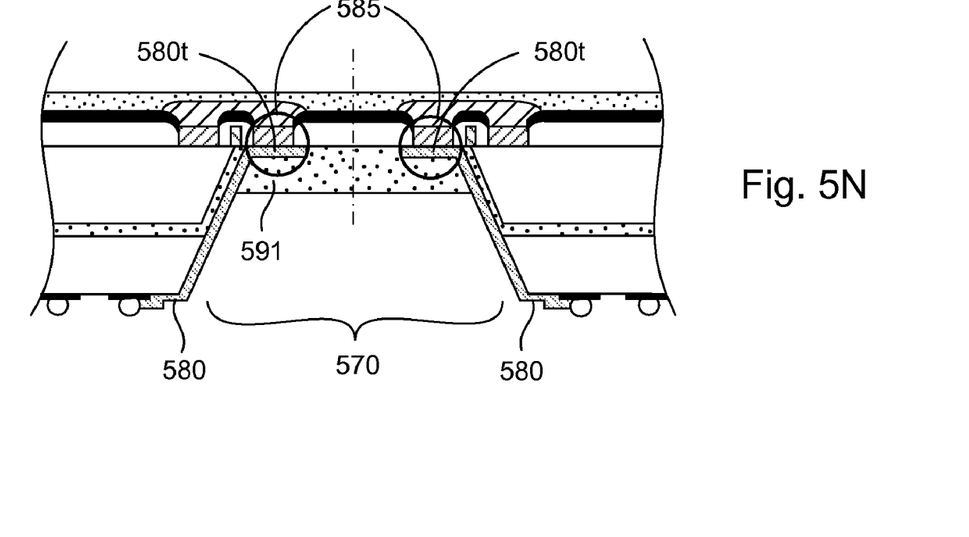

Referring to FIG. 5N, a sealing layer 591 is formed in the notch 570. The tails 580t of the backside metal layer 580 are fully encapsulated by the sealing layer 591. This sealing layer 591 encapsulates and protects the lap junction 585. Suitable sealing materials include epoxies, particularly those that form moisture resistant seals. For example, silica filled epoxy such as 4450 HF manufactured by Dexter, now available through Loctite Corporation can be used.

Figure 5O:
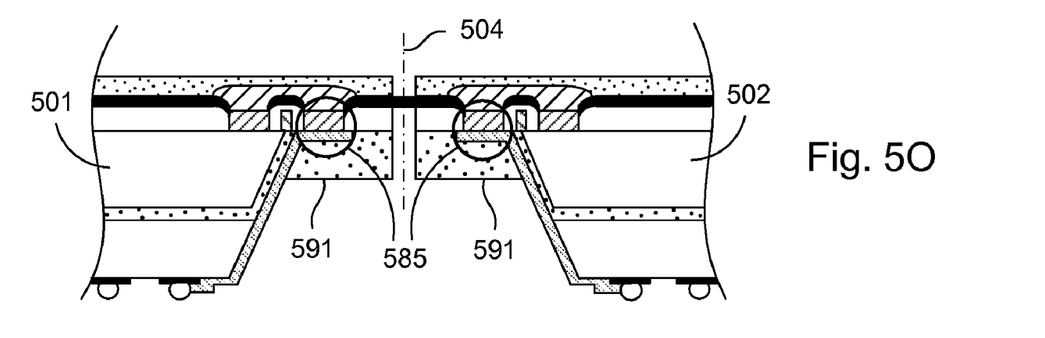

Referring to FIG. 5O, the dies are cut into individual IC chips (singulated). In the depicted example, die 1 501 is separated from die 2 502. In one embodiment, the singulation can be achieved by cutting along the scribe line 504 with a scribing apparatus. For example, a Kulicke & Soffa 775 dicing saw employing a Ni plated diamond loaded blade may be used. Thus each die can be singulated with epoxy sealing layers 591 that fully encapsulate and protect their associated lap junctions 585.

Figure 5P:
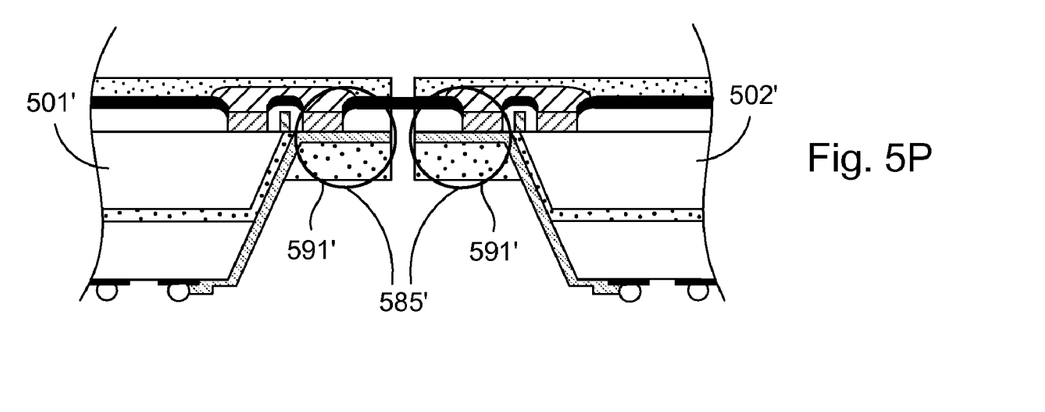

An alternative embodiment is depicted in FIG. 5P. Referring back to FIG. 5L and the discussions pertaining thereto, when a backside metal layer 580' is formed contiguously without an opening (as in 583 of FIG. 5L) the epoxy sealing layer 591' does not completely seal the lap junction 585' during the following processes (e.g., those explained with respect to FIGS. 5M-5O). An exposed edge 592 of the lap junction 585' remains. This exposed edge 592 can either be sealed by further processing of left open at the discretion of the process engineer.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for producing electrical die contact structures for integrated circuit devices, the method including the steps of:
   providing a plurality of integrated circuits on a semiconductor wafer having a front side and a backside, each of the integrated circuits being delineated from other integrated circuits on the wafer by a plurality of saw streets and each integrated circuit including a multiplicity of electrical contact pads with contact pad extensions that extend into the saw streets;
   attaching a front side protective layer to a front side surface of the wafer and wherein the electrical contact pads are electrically isolated from the contact pad extensions by a passivation material and then electrically interconnecting the contact pads and the pad extensions using an overlying bridge of conducting material;
   removing material from the backside of the wafer in the saw streets until a bottom surface of the contact pad extensions is exposed, thereby defining notches along edges of the integrated circuit devices;
   forming electrical connections on the backside of the semiconductor substrate;
   forming a backside metal layer such that a tail portion of the metal layer overlaps the bottom surface of one of the contact pad extensions in one of said notches, the tail portion extending along a side edge of the notch and including a bend at a bottom of the notch such that the tail portion extends from the bend in a direction substantially parallel to the pad extension forming a parallel electrical connection between said contact pad extension and said tail portion such that the contact pad extensions are electrically interconnected with electrical connections; and
   separating the plurality of integrated circuit devices into individual devices.

2. The method of claim 1, wherein the providing step includes providing the semiconductor wafer wherein the integrated circuits comprise optical devices; and
   wherein attaching the front side protective layer comprises attaching an optically transmissive protective layer to a front side surface of the wafer using an optically transmissive adhesive material.

3. The method of claim 1, wherein the step of removing material from the backside of the wafer includes the step of thinning the wafer by removing material from the backside of the wafer.

4. The method of claim 1, wherein the step of forming electrical connections on the backside of the semiconductor substrate includes:
   attaching a backside protective layer to a backside surface of the wafer with a backside adhesive,
   forming electrical connections on a surface of the backside protective layer; and
   wherein the step of forming a backside metal layer includes, removing the backside adhesive material and backside protective layer material in the saw streets and in the notches until a bottom surface of the contact pad extensions is exposed,
   and forming the backside metal layer such that the tail portion of the metal layer overlaps the bottom surface of the contact pad extensions and such that the contact pad extensions are electrically interconnected with electrical connections on the backside protective layer.

5. The method of claim 1, wherein the step of forming electrical connections on the backside of the semiconductor substrate includes forming low modulus pads of material having a low coefficient of thermal expansion and forming solder balls on the low modulus pads.

6. The method of claim 1, wherein the step of forming the backside metal layer includes forming a layer of sealing material in the notch over the backside metal layer.

7. The method of claim 1, wherein the step of forming the backside metal layer includes:
   forming the backside metal layer such that it includes an opening in the notch, thereby separating a backside metal layer of one integrated circuit from a backside metal layer of another adjacent integrated circuit, and includes forming a layer of sealing material in the notch over the backside metal layers such that is fills the opening.

8. A method for producing electrical die contact structures for integrated circuit devices, the method including the steps of:
   providing a plurality of integrated circuits on a semiconductor wafer having a front side and a backside, each of the integrated circuits being delineated from other integrated circuits on the wafer by a plurality of saw streets and each integrated circuit including a multiplicity of electrical contact pads with contact pad extensions that extend into the saw streets; and wherein the electrical pads are isolated from the contact pad extensions by a passivation material and then electrically interconnecting the contact pads and the pad extensions using an overlying bridge of conducting material;
   removing material from the backside of the wafer in the saw streets until a bottom surface of the contact pad extensions is exposed, thereby defining notches along edges of the integrated circuit devices;
   forming electrical connections on the backside of the semiconductor substrate;
   forming a backside metal connector on an edge of an integrated circuit device, the connector having a first end and a second end,
   the first end comprising an angled portion that directs the connector away from the edge and extends into a tail portion that overlaps and extends substantially parallel to the bottom surface of the contact pad extensions to generate an extended contact surface between the tail portion and the contact pad extensions to generate an extended contact surface and such that the second end is in electrical contact with an electrical connection on said contact pad extensions are electrically interconnected with electrical connections; and
   separating the plurality of integrated circuit devices into individual devices.

9. The method of claim 8 wherein
   said removing material from the backside of the wafer is conducted such that said notches have sidewalls and floor surfaces at the bottom of the notches; and
   said forming of the backside metal connector includes the formation of the tail portion that bends and extends away from the notch sidewall in a direction substantially parallel to a lower surface of the contact pad extension, the tail portion having an upper surface and an opposing lower surface on an opposite surface of the tail portion, the upper surface of the tail portion overlaps and extends substantially parallel to the bottom surface of the contact pad extensions providing an extended bond structure between the upper surface of the tail portion and the bottom surface of the contact pad extensions.

10. A method of forming a backside contact, comprising:
    forming a portion of a contact in an active portion of a substrate, the contact comprising electrical contact pads and electrical contact pad extension extending into a region of the substrate; and wherein the electrical pads are isolated from the contact pad extensions by a passivation material and then electrically interconnecting the contact pads and the pad extensions using an overlying bridge of conducting material; including a boundary region between two die of the substrate;

removing material from a backside of the substrate to form an opening in said boundary region, the opening exposing a portion of the contact at a bottom surface of the opening;

forming a conductive line on the backside of the substrate such that the conductive line extends down into the opening and contains a bend at the bottom of the opening which alters the orientation of the conductive line relative to the contact such that it extends a distance directly adjacent to and substantially parallel with the contact in an overlapping configuration to create an electrical lap joint connection between the conductive line and the contact, the conductive line also in electrical contact with an electrical connection on the backside of the substrate; and separating the two die along the boundary through a portion of the contact.

11. A method as recited in claim 10 wherein the boundary between the two die comprises a saw street and wherein separating the two die comprises cutting the die apart using a saw to cut in the saw street.

12. A method as recited in claim 10 wherein removing material from a backside of the substrate to form an opening comprises etching the backside of the substrate to form the opening.

13. A method as recited in claim 12 wherein said etching forms an opening having sloped sidewalls.

14. A method as recited in claim 10 wherein separating the die is followed by a step of sealing edges formed by such separation.

15. A method as recited in claim 10 wherein the lap joint comprises a connection formed of a single alloyed material.

16. A method as recited in claim 10 wherein the method further includes treating the electrical connection on the backside of the substrate with a solder process to form a solder ball on the electrical connection.

17. A method as recited in claim 10 wherein removing material from a backside of the substrate to form a opening comprises etching the backside of the substrate to form the opening.

18. A method as recited in claim 17 wherein said etching forms an opening having sloped sidewalls.

19. A method of forming a backside contact, comprising:
    forming a pair of contacts on an upper portion of a substrate, wherein each of the contacts comprising electrical contact pads and electrical contact pad extensions a first contact electrically connected with a first integrated circuit of the substrate and the second contact electrically connected with a second integrated circuit of the substrate, each contact extending into a region of the substrate between said integrated circuits; and wherein the electrical pads are isolated from the contact pad extensions by a passivation material and then electrically interconnecting the contact pads and the pad extensions using an overlying bridge of conducting material;

removing material from the backside of the substrate to form an opening in the backside of the substrate exposing a portion of each contact;

forming a conductive line in the opening, said line extending between the first and the second contacts across a bottom surface of the opening and overlaps at least some of the exposed portions of both the first and the second contacts, said conductive line also extending toward and electrically connecting with electrical connectors formed on a bottom surface of each die; and separating the first and second integrated circuits along a boundary in said region of between the said integrated circuits.

20. A method as recited in claim 19 wherein the region of the substrate between said integrated circuits comprises a saw street and wherein separating the integrated circuits comprises cutting the die apart using a saw to cut in the saw street.

21. A method as recited in claim 19 wherein separating the die is followed by a step of sealing edges formed by such separation.

22. A method as recited in claim 19 wherein the portion of the conductive line over laps the contact comprises a lap joint and wherein the lap joint is formed of a single alloyed material.

23. A method as recited in claim 19 wherein the method further includes treating the electrical connectors on the backside of the substrate with a solder process to form a solder balls on the electrical connectors.

24. A method for producing electrical die contact structures for integrated circuit devices, the method including the steps of:
    providing a semiconductor wafer having a front side and a back side surface, the wafer including an integrated circuit die delineated from other integrated circuit dice on the wafer by a plurality of saw streets, the wafer including a plurality of contacts comprising electrical contact pads and electrical contact pad extensions wherein at least a portion of the contacts extend into the saw streets; and wherein the electrical pads are isolated from the contact pad extensions by a passivation material and then electrically interconnecting the contact pads and the pad extensions using an overlying bridge of conducting material;

removing material from the back side of the wafer in the saw streets to form an opening having sidewalls and a floor, and further exposes said contact;

forming a bond pad on the backside surface of the die;

forming a backside metal line that electrically connects said bond pad with a portion of said contact, the backside metal line extending from the bond pad up the sidewall of the opening and having a bend at the floor of the opening, the bend changing the direction of the metal line such that extends along the floor, the metal line extending from the bend so that it is substantially parallel with the contact and in conductive contact with the contact thereby establishing electrical contact between said bond pad and outer contact; and separating the plurality of integrated circuit dice into individual devices.

* * * * *

UNITED STATES PATENT AND TRADEMARK OFFICE
CERTIFICATE OF CORRECTION

PATENT NO. : 7,795,126 B2
APPLICATION NO. : 11/969756
DATED : September 14, 2010
INVENTOR(S) : Prabhu et al.

It is certified that error appears in the above-identified patent and that said Letters Patent is hereby corrected as shown below:

In the Claims:

Claim 10, column 13, line 1, change "extension" to --extensions--

Claim 10, column 13, line 2, after "substrate" remove --; and wherein the electrical pads are isolated from the contact pad extensions by a passivation material and then electrically interconnecting the contact pads and the pad extensions using an overlying bridge of conducting material;--

Claim 10, column 13, line 7, after "substrate;" insert --and wherein the electrical pads are isolated from the contact pad extensions by a passivation material and then electrically interconnecting the contact pads and the pad extensions using an overlying bridge of conducting material;--

Signed and Sealed this
Thirteenth Day of December, 2011

David J. Kappos
*Director of the United States Patent and Trademark Office*